(12) United States Patent
Park et al.

(10) Patent No.: US 7,535,322 B2
(45) Date of Patent: May 19, 2009

(54) MONOLITHIC RF FILTER

(75) Inventors: Yun-kwon Park, Dongducheon-si (KR);
 Duck-hwan Kim, Goyang-si (KR);
 Kuang-woo Nam, Yongin-si (KR);
 In-sang Song, Seoul (KR); Seok-chul Yun, Yongin-si (KR); Byeoung-ju Ha, Seongnam-si (KR); Jong-seok Kim, Hwasung-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 291 days.

(21) Appl. No.: 11/269,844

(22) Filed: Nov. 9, 2005

(65) Prior Publication Data

US 2006/0244552 A1 Nov. 2, 2006

(30) Foreign Application Priority Data

Nov. 10, 2004 (KR) ...................... 10-2004-0091362

(51) Int. Cl.
 *H03H 9/54* (2006.01)
 *H03H 9/56* (2006.01)
(52) U.S. Cl. ...................................... 333/189; 333/187
(58) Field of Classification Search ................. 333/187, 333/189, 193, 133
 See application file for complete search history.

(56) References Cited

U.S. PATENT DOCUMENTS

| | | | | |
|---|---|---|---|---|
| 5,194,836 A | * | 3/1993 | Vale et al. | .................... 333/133 |
| 5,789,845 A | * | 8/1998 | Wadaka et al. | ............... 310/334 |
| 6,060,818 A | * | 5/2000 | Ruby et al. | .................. 310/363 |
| 6,081,171 A | | 6/2000 | Ella | |
| 6,150,904 A | | 11/2000 | Taniguchi et al. | |
| 6,262,637 B1 | * | 7/2001 | Bradley et al. | ............... 333/133 |
| RE37,639 E | * | 4/2002 | Ehara et al. | .................. 333/193 |

(Continued)

FOREIGN PATENT DOCUMENTS

EP 1 225 695 A2 7/2002

(Continued)

OTHER PUBLICATIONS

Jie Long et al., A 2.4 GHz Low-Power Low-Phase-Noise CMOS VCO Using Spiral Inductors and Junction Varactors, Circuits and Systems, 2004, ISCAS 2004, Proceedings of the 2004 International Symposium on Vancouver, BC, Canada May 23-26, 2004, Piscataway, NJ, USA, IEEE, US, May 23, 2004, pp. 545-548.

(Continued)

*Primary Examiner*—Barbara Summons
(74) *Attorney, Agent, or Firm*—Buchanan Ingersoll & Rooney PC

(57) ABSTRACT

A filter formed of film bulk acoustic resonators has a topology that enables a trimming inductor to be fabricated on the same substrate as the resonator arrays. The entire filter can be fabricated on a single chip, utilizing only integrated circuit processes. In an exemplary embodiment, a pair of shunt resonators each have one electrode connected to series-connected resonators. The other electrodes of the two shunt resonators are connected in common to one another. The trimming inductor is connected between the common electrode and ground potential. A third shunt resonator is connected between the series-connected resonators and ground potential.

13 Claims, 3 Drawing Sheets

U.S. PATENT DOCUMENTS

| | | | |
|---|---|---|---|
| 6,747,530 B1 | 6/2004 | Selmeier | |
| 6,768,396 B2 * | 7/2004 | Klee et al. | 333/187 |
| 7,042,312 B2 * | 5/2006 | Sul et al. | 333/187 |
| 7,145,417 B2 | 12/2006 | Kimachi et al. | |
| 7,250,831 B2 * | 7/2007 | Song et al. | 333/133 |
| 2002/0109564 A1 | 8/2002 | Tsai et al. | |
| 2003/0009863 A1 | 1/2003 | Figueredo et al. | |
| 2003/0186673 A1 | 10/2003 | Kimachi et al. | |
| 2003/0205948 A1 | 11/2003 | Lin et al. | |
| 2004/0032012 A1 | 2/2004 | Wong et al. | |
| 2004/0164367 A1 | 8/2004 | Park | |
| 2005/0073377 A1 * | 4/2005 | Sul et al. | 333/189 |
| 2005/0134401 A1 * | 6/2005 | Song et al. | 333/133 |
| 2005/0218755 A1 | 10/2005 | Song et al. | |

FOREIGN PATENT DOCUMENTS

| | | |
|---|---|---|
| EP | 1 231 713 A2 | 8/2002 |
| JP | 60-87513 | 5/1985 |
| JP | 8-51334 | 2/1996 |
| JP | 10-200370 | 7/1998 |
| JP | 11-346140 | 12/1999 |
| JP | 2000-151356 | 5/2000 |
| JP | 2003-110404 | 4/2003 |
| JP | 2003-298392 | 10/2003 |
| JP | 2004-112277 | 4/2004 |
| KR | 1998-070285 A | 10/1998 |
| KR | 2002-0014829 A | 2/2002 |
| WO | 2004/075402 A1 | 9/2004 |

OTHER PUBLICATIONS

Marksteiner S. et al., Institute of Electrical and Electronics Engineers: "A miniature BAW duplexer using flip-chip on LTCC", 2003 IEEE Ultrasonics Symposium Proceedings, Honolulu, Hawaii, vol. 1 of 2, Oct. 5, 2003, pp. 1794-1797.

Tai, C.H., et al., "A Novel Thin Film Bulk Acoustic Resonator (FBAR) Duplexer for Wireless Applications", Tamkang Journal of Science and Engineering, vol. 7, No. 2, Jun. 2004, pp. 67-71.

Christensen K.T. et al., "Easy simulation and design of on-chip inductors in standard CMOS processes", Circuit and Systems, 1998, ISCAS 1998, Proceedings of the 1998 IEEE International Symposium on Monterey, CA, USA, May 31-Jun. 3, 1998, New York, NY, USA, IEEE, US, vol. 4, May 31, 1998, pp. 360-364.

European Search Report dated Mar. 6, 2006.

Extended European Search Report issued in corresponding European Patent Application No. 05 02 4448, EPO, Munich, DE dated Jun. 11, 2007.

Lakin, K.M., "Thin Film Resonator Technology," IEEE International Frequency Control Symposium & PDA Exhibition Jointly with the 17th European Frequency and Time Forum, May 4, 2003-May 8, 2003, pp. 765-778, IEEE, New York, NY.

Huynh, N-H, et al., "Ultra small PCS Duplexer in Plastic Package using Bulk Acoustic Wave (BAW) Filter Technology," 34th European Microwave Conference, Amsterdam, Oct. 11, 2004-Oct. 13, 2004, pp. 393-396.

Seabury, C.W., et al., "Thin Film ZnO Based Bulk Acoustic Mode Filters," IEEE MTT-S International Microwave Symposium Digest, 1997, Jun. 8, 1997-Jun. 13, 1997, pp. 181-184, vol. 1, IEEE, New York, NY.

Official Action issued by the Korean Intellectual Property Office in related KR Patent Application No. 10-2007-0063668, Jul. 16, 2007.

Office Action issued Jul. 15, 2008 from the Japanese Patent Office in corresponding Japanese Patent Application No. 2005-326277.

* cited by examiner

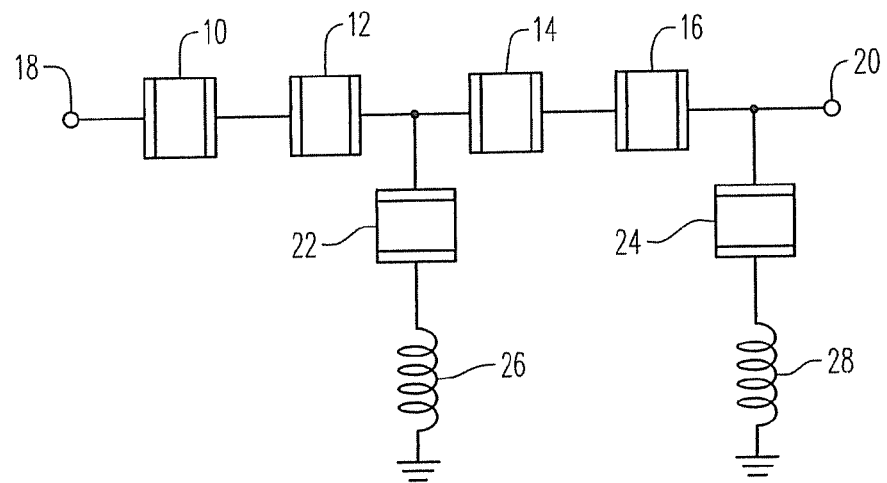
FIG. 1
(conventional)

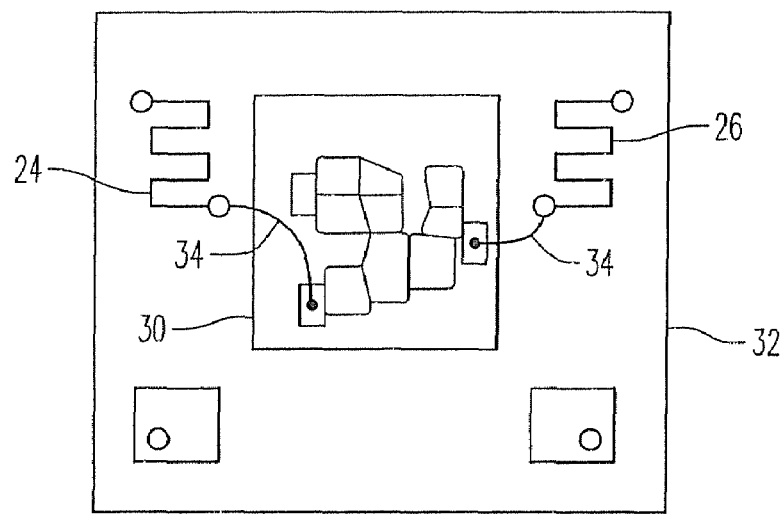
FIG. 3
(conventional)

MONOLITHIC RF FILTER

This application claims priority under 35 U.S.C. § 119 to Korean Patent Application No. 10-2004-0091362, which was filed on 10 Nov. 2004 in the Korean Intellectual Property Office, the disclosure of which is incorporated herein in its entirety by reference.

FIELD OF THE INVENTION

The present invention relates to radio-frequency filters, and more particularly to a monolithic RF filter on a single integrated circuit chip that employs film bulk acoustic resonators.

BACKGROUND OF THE INVENTION

Bandpass and notch filters that are constructed with film bulk acoustic resonators (FBARs) have become viable alternatives to ceramic filters and surface acoustic wave (SAW) filters for use in portable telecommunications devices, such as cellular telephones, personal digital assistants, and the like. FBAR filters have a much smaller size than ceramic filters, making them more desirable for use in these types of portable communication devices. In addition, they offer better performance capabilities than SAW filters. Unlike ceramic and SAW filters, FBAR filters are compatible with standard integrated circuit fabrication technologies.

An FBAR device essentially comprises a piezoelectric layer, such as zinc oxide or aluminum nitride, sandwiched between two electrodes. This structure is positioned above a cavity in a substrate. To construct a bandpass filter, multiple resonators are combined in a ladder configuration to form an array. An example of such a configuration is illustrated in FIG. 1. This example comprises four FBARs 10, 12, 14 and 16 connected in series between an input port 18 and an output port 20. When employed as a transmit filter in a cellular telephone, for instance, the input port might be connected to a power amplifier, and the output port can be connected to an antenna. Shunt resonators 22 and 24 are connected between an electrode of a series resonator and a ground reference potential. The FBARs can be fabricated on a single substrate, e.g. silicon, as an integrated circuit.

Each FBAR exhibits fundamental resonance at a frequency that is dependent upon the thickness of the layers of the FBAR, among other factors. In constructing the filter, the series FBAR elements are designed so that their maximum peak resonance is at the desired center frequency for the bandpass filter, to thereby transmit signals at that frequency. The shunt FBAR elements resonate at a frequency that is slightly offset from the series elements, e.g. 7-8% lower, to thereby shunt signals at frequencies outside of the pass band to ground and yield a flat bandpass profile.

The equivalent circuit of an FBAR can be represented by a Butterworth-Van Dyke circuit, as illustrated in FIG. 2a. This circuit models the resonator as a constant clamped capacitance $C_o$ in parallel with an acoustic, or "motional," arm that comprises a motional capacitance $C_m$, motional inductance $L_m$ and motional resistance $R_m$. The value $C_o$ is the electrical capacitance between the two electrodes through which the electric field is applied. The motional components represent the electromechanical response of the piezoelectric material.

As illustrated in the example of FIG. 1, trimming inductors 26 and 28 can be placed in series with respective shunt FBARs 22 and 24, to tune the bandwidth and attenuation characteristics of the filter. The effect of each trimming inductor is to place an additional inductance $L_t$ in series with the two parallel arms of the equivalent circuit, as depicted in FIG. 2b.

Conventionally, for a filter having a topology of the type illustrated in FIG. 1, the trimming inductors each have an inductance on the order of about 2 nH. An inductance of this value requires an inductor which is too large to fabricate on the substrate of the FBAR integrated circuit, in a practical implementation of the filter. To achieve the desired performance, the inductor lines would have to be too thick and/or too long. Conventionally, therefore, the trimming inductors are discrete devices fabricated separately from the FBARs, and then connected thereto by wire bonding or the like.

Referring to FIG. 3, the FBAR components of the filter are fabricated on a wafer of silicon, or the like, that forms a chip 30. Due to their required size, the trimming inductors 24 and 26 are separately formed on, or in, a printed circuit board 32. The chip 30 is mounted on the printed circuit board 32, and the inductors are then connected to the shunt FBARs by means of wire bonds 34.

The fabrication of the trimming inductors separately from the FBAR arrays, for instance on a printed circuit board, presents certain limitations. First, the need for two fabrication processes results in costs that are greater than the cost of an IC process alone. Second, the need to perform the wire bonding step further adds to the expense of the filter. Third, the requirement of a printed circuit board, or other structure to support the trimming inductors, increases the overall size of the filter. Fourth, parasitic elements inherent to the printed circuit board adversely affect the performance of the filter.

SUMMARY OF THE INVENTION

In accordance with the present invention, these limitations are overcome by a filter topology that enables the size of the trimming inductor to be reduced. As a result, the trimming inductor can be fabricated on the same substrate as the FBAR arrays, to thereby enable the entire filter to be fabricated on a single chip, utilizing only integrated circuit processes. Furthermore, the need for the wire bonding step, to connect the components of the filter, is eliminated.

In accordance with one embodiment of the invention, a pair of shunt resonators each have one electrode connected to the series-connected resonators. The other electrodes of the two shunt resonators are connected in common to one another. A trimming inductor is connected between the common electrode and ground potential. A third shunt resonator is connected between the series-connected resonators and ground potential. By means of this arrangement, the trimming inductor can be made sufficiently small that it can be included on the integrated circuit chip.

In accordance with another aspect of the invention, the integrated circuit chip has a structure that minimizes the steps needed to manufacture the chip. In particular, one electrode of each of the FBARs, as well as the trimming inductor and a ground potential connection pad of the chip, are all formed in the same metal layer of the chip. As a result, all of these components can be simultaneously fabricated with a single masking step, to reduce process costs.

These and other features of the invention, and the advantages achieved thereby, are described in greater detail hereinafter with reference to exemplary embodiments illustrated in the accompanying drawings.

BRIEF DESCRIPTION OF THE DRAWING FIGURES

FIG. 1 is a schematic representation of a conventional FBAR bandpass filter;

FIG. 3 is a plan view of the physical structure of a conventional FBAR filter with trimming inductors;

DETAILED DESCRIPTION

To facilitate an understanding of the present invention, it is described hereinafter with reference to exemplary embodiments of a bandpass filter. It will be appreciated, however, that these embodiments are not the only feasible implementations of the invention. For instance, materials other than those specifically mentioned herein can be employed to construct the resonators. The following description should therefore not be viewed as placing limitations on the scope of the invention.

Figure 2A:
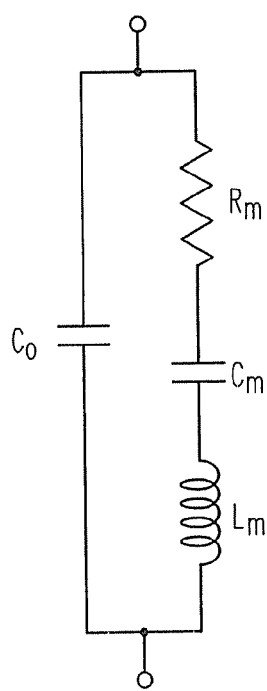
FIG. 2a is a circuit diagram of the equivalent circuit for an FBAR.
Figure 2B:
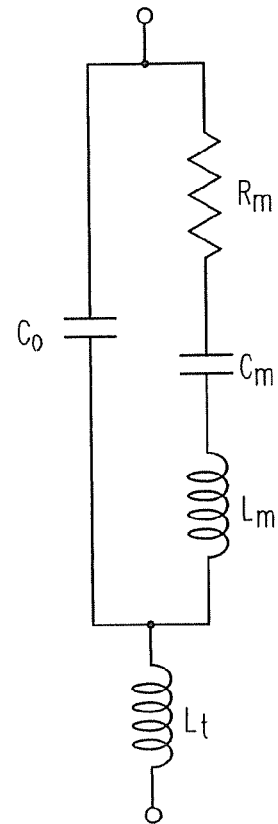
FIG. 2b is a circuit diagram of the equivalent circuit with an added trimming inductor.
Figure 4:
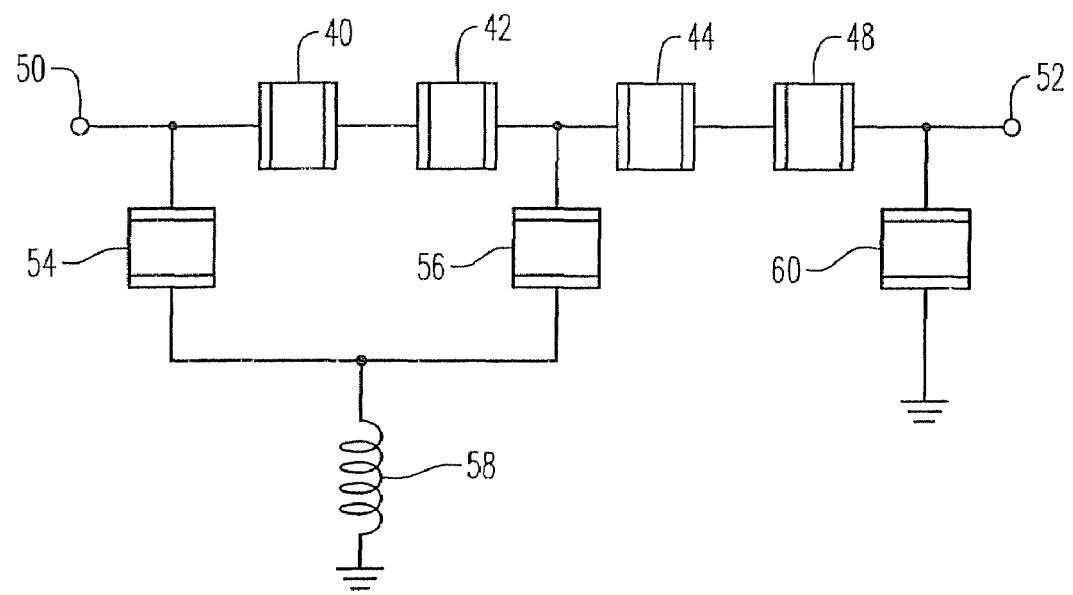
FIG. 4 is a schematic representation of one embodiment of an FBAR filter in accordance with an embodiment of the present invention.

A schematic representation of one embodiment of an FBAR filter that implements principles of the present invention is illustrated in FIG. 4. Referring thereto, the filter includes series resonators 40, 42, 44 and 48 connected between an input port 50 and an output port 52. A pair of parallel connected shunt resonators 54 and 56 each have a first electrode thereof connected on opposite sides of one or more of the series resonators. In the illustrated example, the first electrode of the shunt resonator 54 is connected to the input port 50, in common with one electrode of the first series resonator 40. The first electrode of the other shunt resonator is connected to the junction of the electrodes of the series resonators 42 and 44. The second electrodes of each of the two shunt resonators 54 and 56 are connected to one another. In this example, therefore, the pair of shunt resonators 54 and 56 straddle the two series resonators 40 and 42. The common second electrode of the two shunt resonators is connected to ground through a trimming inductor 58. A separate shunt resonator 60 is connected between the output terminal 52 and ground to improve attenuation at frequencies below the pass band.

The first parallel resonator 54 may be designed to have a larger capacitance than that of a connected serial resonator (hereinafter called "first serial resonator") 40. The second parallel resonator 56 may also be designed to have a larger capacitance than that of a connected serial resonator (hereinafter called "second serial resonator") 42. Therefore, each of the parallel resonators 54 and 56 can be connected with the inductor 58 with lower inductance, and as a result, it is possible to use only one trimming inductor.

As a result of this topology, the trimming inductor 58 can be much smaller than trimming inductors that were previously employed, as in the example of FIG. 1. For instance, the trimming inductor 58 can have an inductance value of 1 nH or less, e.g. 0.4-0.8 nH. As a result of its small size, the inductor lends itself to integrated circuit fabrication techniques. Consequently, the inductor can be fabricated on the same wafer as the FBAR elements, to form a monolithic filter on a single chip.

While the embodiment of FIG. 4 illustrates a single inductor 58, it is also possible to employ multiple inductors connected in parallel or in series between the common electrode of the shunt resonators 54 and 56 and ground, to increase or control the Q value of the inductance.

Figure 5:
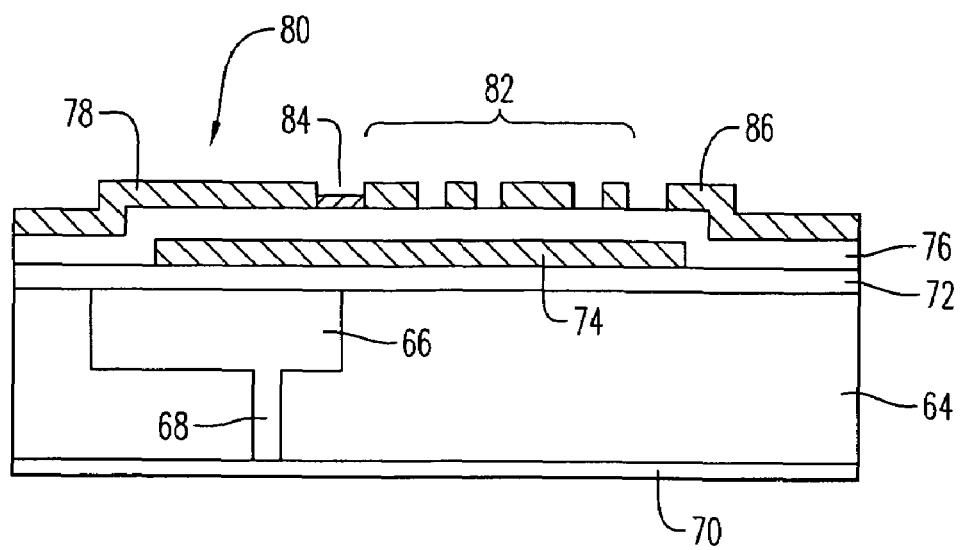
FIG. 5 is a cross-sectional side view of an embodiment of a chip incorporating an integrated FBAR and trimming inductor in accordance with principles of the present invention.

One example of a monolithic construction integrating the trimming inductor with an FBAR is illustrated in the cross-sectional side view of FIG. 5. The integrated circuit is formed on a substrate 64, such as silicon or gallium arsenide. A chamber or cavity 66 is formed in the substrate, and connected to the bottom surface of the substrate by means of a via 68. A bottom layer 70 forms a hermetic seal for the structure. A cover layer 72 of a suitable material, such as aluminum nitride, forms a supporting membrane and functions as a barrier, i.e., an etch stop layer. Preferably, the membrane has a thickness less than 500 A, to reduce acoustic loss and enhance the Q-factor of the filter. A metallic conductive layer 74, e.g., Molybdenum, overlies at least a portion of the cavity 66, and forms the bottom electrode of the FBAR. A piezoelectric layer 76 is deposited or otherwise coated over the bottom electrode 74 and the cover layer 72. The piezoelectric material could be aluminum nitride or zinc oxide, for example. A top electrode 78 overlies a portion of the piezoelectric layer 76 and the bottom electrode layer 74, to form the sandwich construction of the FBAR in an area 80.

The windings 82 of the trimming inductor are formed on the piezoelectric layer adjacent the top electrode 78. In the illustrated embodiment, the windings are linear, with a serpentine configuration. Alternatively, the windings could have a spiral shape. In this embodiment, one end of the inductor is connected to the top electrode 78 by means of a suitable interconnect 84. The other end of the inductor is connected to another electrode 86 that leads to a contact pad of the chip, for connection to a ground potential.

It is possible to adjust the area 80 of the resonator (i.e., the common area shared by lower electrode 74, piezoelectric layer 76 and upper electrode 78) to increase the capacitance. More specifically, the area of the first parallel resonator 54 is made larger than that of the first serial resonator 40, and the area of the second parallel resonator 56 is made larger than that of the second serial resonator 42, such that each of the parallel resonators 54 and 56 can have larger capacitance than that of the serial resonators 40 and 42, in the exemplary embodiment.

This type of construction results in an efficient, and less expensive, integrated circuit manufacturing process. In particular, the top electrode 78 of the FBAR, the windings 82 of the trimming inductor, and the contact pad for the ground reference potential are all embodied in the same metallic layer of the chip. Consequently, a single mask can be employed to form all of these components simultaneously, rather than requiring separate masks and their associated process steps.

Figure 6:
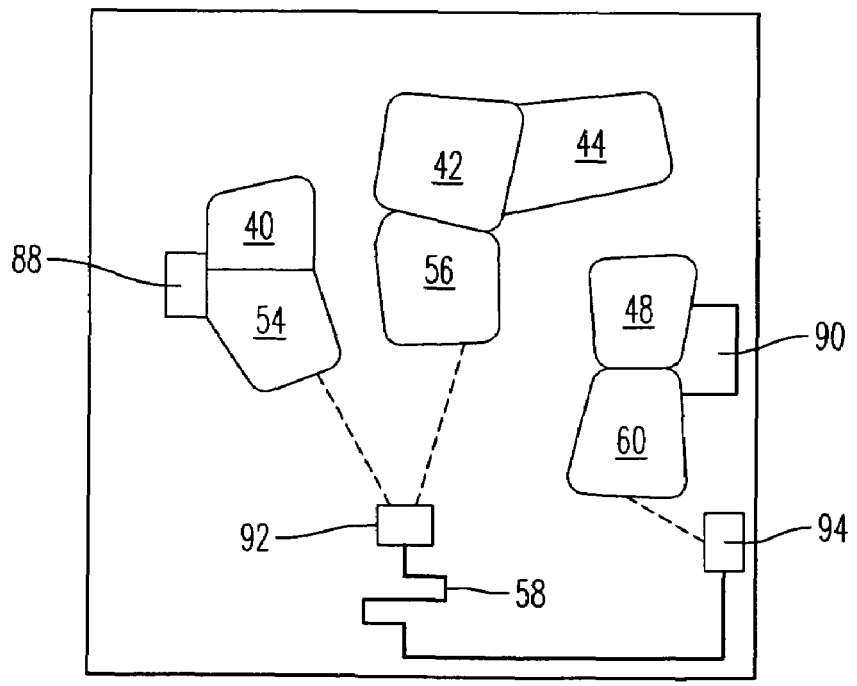
FIG. 6 is a plan view of the topology of an exemplary chip in which the circuit of FIG. 4 can be implemented.

FIG. 6 illustrates a top view of the monolithic structure that forms the FBAR filter, with an integrated trimming inductor, corresponding to the example of FIG. 4. As illustrated therein, the first series resonator 40 and the first shunt resonator 54 share a common top electrode that is connected to one pad 88 of the chip, which forms the input port 50. The second series resonator 42 and the second shunt resonator 56 also share a common top electrode. The third series resonator 44 also shares its top electrode in common with the second series resonator 42 and second shunt resonator 56. The fourth series resonator 48 and the third shunt resonator 60 share a common top electrode, which is connected to another pad 90 of the chip, that forms the output port 52. To provide a frequency difference between series resonators and shunt resonators, an additional thickness of the electrode material can be deposited on the top electrodes of the shunt resonators.

One end 92 of the trimming inductor 58 is connected to a common electrode of the shunt resonators 54 and 56. In the illustrated embodiment, this common electrode is the bottom electrode, and therefore the inductor is connected through a vertical via in the piezoelectric layer (not shown). The other end of the inductor is connected to a third pad 94, which connects to the ground reference potential.

With reference to FIG. 4. of the application, there are a plurality of serial resonators 40, 42, 44, 48 in use. The first parallel resonator 54 is connected to one end of the first serial resonator 40, and the second parallel resonator 56 is connected between the second and third serial resonators 42 and 44. The serial resonators 40, 42, 44, 46 are fabricated to have uniform area, and the first and second parallel resonators 54 and 56 are fabricated to have larger areas than that of the respective serial resonators. As a result, the parallel resonators 54 and 56 may have larger capacitance than that of the serial resonators 40, 42, 44, 48.

From the foregoing, it can be seen that embodiments of the present invention provide a topology for an FBAR filter which accommodates a trimming inductor of sufficiently small size that it can be fabricated on the same chip as the FBAR components. As a result, the entire filter is a monolithic structure that avoids the need for a separate printed circuit board to support the trimming inductor. Since the entire structure of the filter is fabricated with integrated circuit processes, the overall cost of manufacturing is reduced. Furthermore, by avoiding the need for wire bonds to connect the trimming inductors to the FBARs, the cost is further reduced.

Performance of the filter is also enhanced by integrating all of the components on a single chip. The parasitic elements that inherently accompany a separate circuit board and wire bonds are eliminated.

It will be appreciated by those of ordinary skill in the art that the principles which underlie the present invention can be embodied in other forms without departing from their spirit or scope. For example, while the embodiment illustrated in FIG. 4 depicts the pair of connected shunt resonators as straddling two series resonators, the number of series resonators located between the shunt resonators can be varied.

Accordingly, the foregoing description should be viewed as illustrative, and not restrictive. The scope of the invention is indicated by the appended claims, and all changes that come within the meaning and range of equivalents thereof are intended to be embraced therein.

What is claimed is:

1. A filter comprising:
a plurality of acoustic resonators connected in series between an input port and an output port on an integrated circuit chip, each of said resonators having a pair of electrodes;
a first shunt resonator on said integrated circuit chip having a first electrode, connected to an electrode of one of said series-connected resonators, and a second electrode;
a second shunt resonator on said integrated circuit chip having a first electrode, connected to another electrode of said series-connected resonators, and a second electrode connected to the second electrode of said first shunt resonator; and
an inductor on said integrated-circuit chip having one end connected to said second electrodes of said shunt resonators and another end connected to a contact pad of said chip,
wherein an area of the first shunt resonator is made larger than that of a first acoustic resonator of said plurality of acoustic resonators connected in series, said first acoustic resonator being connected to the input port, and wherein an area of the second shunt resonator is larger than that of a second acoustic resonator of the plurality of acoustic resonators which is connected to the first acoustic resonator.

2. The filter of claim 1, further including a third shunt resonator on said integrated-circuit chip having one electrode connected to a third electrode of said series-connected resonators and another electrode connected to a contact pad of said chip.

3. The filter of claim 2, wherein said one electrode of said third shunt resonator is connected to said output port in common with said third electrode of said series-connected resonators.

4. The filter of claim 1, wherein said first electrode of said first shunt resonator is connected to said input port.

5. The filter of claim 1, wherein each of said resonators comprises a film bulk acoustic resonator.

6. The filter of claim 1, wherein said inductor has an inductance value of 1 nH or less.

7. An integrated circuit, comprising:
a substrate having a cavity therein;
a first conductive layer disposed over at least a portion of said cavity to form a first electrode;
a piezoelectric layer on said first conductive layer; and
a second conductive layer on said piezoelectric layer, said second conductive layer having a pattern that includes a second electrode disposed over said first electrode, an inductor, and a connection pad to which one end of said inductor is connected, wherein the inductor is adjacent the second electrode of the second conductive layer and on the piezoelectric layer above the first electrode of the first conductive layer.

8. The integrated circuit of claim 7, wherein the other end of said inductor is connected to one of said first and second electrodes.

9. The integrated circuit of claim 7, further including a barrier layer between said substrate and said first conductive layer.

10. The integrated circuit of claim 7, further including a via that connects said cavity to a surface of said substrate that is remote from said first conductive layer, and a protective layer that covers said surface.

11. The integrated circuit of claim 7, wherein said inductor has an inductance value of 1 nH or less.

12. The integrated circuit of claim 7 having a plurality of areas that each comprises a bottom electrode implemented in said first conductive layer, an intermediate piezoelectric layer, and a top electrode implemented in said second conductive layer to form a resonator, and wherein adjacent acoustic resonators share one of said electrodes in common.

13. The integrated circuit of claim 12, wherein at least two of the areas of said plurality of areas differ from one another to thereby result in different capacitances of the resonators formed by said at least two areas.

* * * * *